(12) United States Patent
Nishijima

(10) Patent No.: US 7,756,224 B2
(45) Date of Patent: Jul. 13, 2010

(54) VITERBI DECODING CIRCUIT AND WIRELESS DEVICE

(75) Inventor: Seiichi Nishijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 778 days.

(21) Appl. No.: 11/544,625

(22) Filed: Oct. 10, 2006

(65) Prior Publication Data

US 2007/0183539 A1 Aug. 9, 2007

(30) Foreign Application Priority Data

Feb. 9, 2006 (JP) .............................. 2006-032963

(51) Int. Cl.
*H04L 27/06* (2006.01)
(52) U.S. Cl. ..................................................... 375/341
(58) Field of Classification Search ................. 375/261, 375/262, 265; 714/758, 759, 792, 795, 796, 714/794
See application file for complete search history.

(56) References Cited

U.S. PATENT DOCUMENTS

| 2002/0106033 | A1* | 8/2002 | Uesugi ....................... 375/262 |
| 2004/0255230 | A1* | 12/2004 | Chen et al. .................. 714/796 |
| 2005/0278605 | A1* | 12/2005 | Xu et al. ..................... 714/758 |

FOREIGN PATENT DOCUMENTS

EP 1 223 679 A1 7/2002

JP 2005-101753 A 4/2005

OTHER PUBLICATIONS

Kanu Chadha et al., "A Reconfigurable Viterbi Decoder Architecture", Conference Record of the 35th, Asilomar Conference on Signals, Systems & Computers, vol. 1 of 2, Conference 35, Nov. 4, 2001 pp. 66-71, XP010580894.
Dale E. Hocevar et al, "Achieving Flexibility in a Viterbi Decoder DSP Coprocessor", Proc. Vehicular Technology Conference 2000, vol. 5, Sep. 24, 2000, pp. 2257-2264, XP010522182.
Patrick H. Kelly et al., "A Flexible Constraint Length, Foldable Viterbi Decoder", Proc. Global Telecommunications Conference 1993, Nov. 29, 1993, pp. 631-635, XP010109737.

(Continued)

*Primary Examiner*—Chieh M Fan
*Assistant Examiner*—Jaison Joseph
(74) *Attorney, Agent, or Firm*—Arent Fox LLP

(57) ABSTRACT

A setting register is provided in which parameters including a code rate, a constraint length, and a generator polynomial are changeably set according to a type of wireless communication standard, the parameters. A branch metric calculating unit generates branch metric information in an amount according to the code rate. A replica generating unit replicates, based on the generator polynomial, a specification of an encoder at a transmitting-end, and generates setting information related to selection of the branch metric information. A branch metric selection unit performs selection of an upper branch metric and a lower branch metric from among a plurality of pieces of the branch metric information, based on the setting information. An ACS unit determines a path metric for each step in a trellis diagram based on the upper branch metric and the lower branch metric, and to determine a surviving branch and a path metric value.

10 Claims, 15 Drawing Sheets

OTHER PUBLICATIONS

Mohammed Benaissa et al., "A Novel High-Speed Configurable Viterbi Decoder for Broadband Access", Eurasip Journal of Applied Signal Processing, Hindawi Publishing Co., Cuyahoga Falls, OH, US, vol. 13, Dec. 13, 2003, pp. 1317-1327, XP002337526.

Cheng Zhan et al., "Domain Specific Reconfigurable Fabric Targeting Viterbi Algorithm", Proc. International Conference on Field-Programmable Technology, Dec. 6, 2004, pp. 363-366, XP010767580.

* cited by examiner

FIG.6

| COMMUNICATION STANDARD | PARAMETERS | | |
|---|---|---|---|
| | CODE RATE | GENERATOR POLYNOMIALS [BINARY] | CONSTRAINT LENGTH (NUMBER OF STATES:= $2^{\text{CONSTRAINT LENGTH}-1}$) |
| WIRELESS LAN IEEE 802.11a | 1/2 | G0=1011011 G1=1111001 | 7(64) |
| WIRELESS LAN IEEE 802.11b | 1/2 | G0=1011011 G1=1111101 | 7(64) |
| THIRD GENERATION MOBILE PHONE WCDMA | 1/2 | G0=101110001 G1=111101011 | 9(256) |
| | 1/3 | G0=101101111 G1=110110000 G2=111001001 | 9(256) |
| DIGITAL BROADCASTING ISDB-T | 1/2 | G0=1011011 G1=1111001 | 7(64) |
| SHORT-RANGE RADIO IEEE802.15 | 1/3 | G0=1011011 G1=1110101 G2=1111001 | 7(64) |

FIG.12

| ACS CALCULATOR NUMBER OF OUTPUT DESTINATION | ACS CALCULATOR NUMBER (1) OF OUTPUT SOURCE | ACS CALCULATOR NUMBER (2) OF OUTPUT SOURCE |
|---|---|---|
| 0 | 0 | 32 |
| 1 | 0 | 32 |
| 2 | 1 | 33 |
| 3 | 1 | 33 |
| 4 | 2 | 34 |
| 5 | 2 | 34 |
| 6 | 3 | 35 |
| 7 | 3 | 35 |
| 8 | 4 | 36 |
| 9 | 4 | 36 |
| 10 | 5 | 37 |
| 11 | 5 | 37 |
| 12 | 6 | 38 |
| 13 | 6 | 38 |
| 14 | 7 | 39 |
| 15 | 7 | 39 |
| 16 | 8 | 40 |
| 17 | 8 | 40 |
| 18 | 9 | 41 |
| 19 | 9 | 41 |
| 20 | 10 | 42 |
| 21 | 10 | 42 |
| 22 | 11 | 43 |
| 23 | 11 | 43 |
| 24 | 12 | 44 |
| 25 | 12 | 44 |
| 26 | 13 | 45 |
| 27 | 13 | 45 |
| 28 | 14 | 46 |
| 29 | 14 | 46 |
| 30 | 15 | 47 |
| 31 | 15 | 47 |
| 32 | 16 | 48 |
| 33 | 16 | 48 |
| 34 | 17 | 49 |
| 35 | 17 | 49 |
| 36 | 18 | 50 |
| 37 | 18 | 50 |
| 38 | 19 | 51 |
| 39 | 19 | 51 |
| 40 | 20 | 52 |
| 41 | 20 | 52 |
| 42 | 21 | 53 |
| 43 | 21 | 53 |
| 44 | 22 | 54 |
| 45 | 22 | 54 |
| 46 | 23 | 55 |
| 47 | 23 | 55 |
| 48 | 24 | 56 |
| 49 | 24 | 56 |
| 50 | 25 | 57 |
| 51 | 25 | 57 |
| 52 | 26 | 58 |
| 53 | 26 | 58 |
| 54 | 27 | 59 |
| 55 | 27 | 59 |
| 56 | 28 | 60 |
| 57 | 28 | 60 |
| 58 | 29 | 61 |
| 59 | 29 | 61 |
| 60 | 30 | 62 |
| 61 | 30 | 62 |
| 62 | 31 | 63 |
| 63 | 31 | 63 |

FIG.14

| ACS CALCULATOR NUMBER OF OUTPUT DESTINATION | ACS CALCULATOR NUMBER (1) OF OUTPUT SOURCE | ACS CALCULATOR NUMBER (2) OF OUTPUT SOURCE |
|---|---|---|
| 0 | 0 | 128 |
| 1 | 0 | 128 |
| 2 | 1 | 129 |
| 3 | 1 | 129 |
| 4 | 2 | 130 |
| 5 | 2 | 130 |
| 6 | 3 | 131 |
| 7 | 3 | 131 |
| 8 | 4 | 132 |
| 9 | 4 | 132 |
| 10 | 5 | 133 |
| 11 | 5 | 133 |
| 12 | 6 | 134 |
| 13 | 6 | 134 |
| 14 | 7 | 135 |
| 15 | 7 | 135 |
| 16 | 8 | 136 |
| 17 | 8 | 136 |
| 18 | 9 | 137 |
| 19 | 9 | 137 |
| 20 | 10 | 138 |
| 21 | 10 | 138 |
| 22 | 11 | 139 |
| 23 | 11 | 139 |
| 24 | 12 | 140 |
| 25 | 12 | 140 |
| 26 | 13 | 141 |
| 27 | 13 | 141 |
| 28 | 14 | 142 |
| 29 | 14 | 142 |
| 30 | 15 | 143 |
| 31 | 15 | 143 |
| 32 | 16 | 144 |
| 33 | 16 | 144 |
| 34 | 17 | 145 |
| 35 | 17 | 145 |
| 36 | 18 | 146 |
| 37 | 18 | 146 |
| 38 | 19 | 147 |
| 39 | 19 | 147 |
| 40 | 20 | 148 |
| 41 | 20 | 148 |
| 42 | 21 | 149 |
| 43 | 21 | 149 |
| 44 | 22 | 150 |
| 45 | 22 | 150 |
| 46 | 23 | 151 |
| 47 | 23 | 151 |
| 48 | 24 | 152 |
| 49 | 24 | 152 |
| 50 | 25 | 153 |
| 51 | 25 | 153 |
| 52 | 26 | 154 |
| 53 | 26 | 154 |
| 54 | 27 | 155 |
| 55 | 27 | 155 |
| 56 | 28 | 156 |
| 57 | 28 | 156 |
| 58 | 29 | 157 |
| 59 | 29 | 157 |
| 60 | 30 | 158 |
| 61 | 30 | 158 |
| 62 | 31 | 159 |
| 63 | 31 | 159 |

VITERBI DECODING CIRCUIT AND WIRELESS DEVICE

CROSS-REFERENCE TO RELATED APPLICATIONS

This application is based upon and claims the benefit of priority from the prior Japanese Patent Application No. 2006-032963, filed on Feb. 9, 2006, the entire contents of which are incorporated herein by reference.

BACKGROUND OF THE INVENTION

1. Field of the Invention

The present invention relates to a Viterbi decoding circuit and a wireless device.

2. Description of the Related Art

In wireless communication, transmission data is sometimes damaged by disturbances that occur during transmission, thereby causing an error in the data. Therefore, a transmitting-end performs error correction coding on data and transmits the encoded data, and a receiving-end corrects the errors in the received data. A Viterbi decoding circuit is used to perform error correction at a receiving-end. A software wireless device processes a wireless processing, which has conventionally been actualized by hardware, by overwriting software of a hardware component. The Viterbi decoding circuit is one of the main component circuits in the wireless device.

A convolutional encoder is a widely-used error correction encoder. The convolutional encoder is uniquely represented by three types of parameters: (1) a code rate; (2) a constraint length; and (3) generator polynomials. The three parameters are determined for each wireless technology, such as a wireless local area network (LAN) and at third-generation mobile phone.

FIG. 1 is a schematic of the convolutional encoder. To avoid complicated explanations, in this example, the code rate is ½, the constraint length is 3, and the generator polynomials G0 and G1 are 111 (binary) and 101 (binary), respectively. The convolutional encoder with a constraint length of 3 is not implemented in practice.

The code rate ½ in the parameters means that the convolutional encoder has one input and two outputs, as shown in FIG. 1. There are two pieces of output information, an output A and an output B, to one piece of input information, and thus, the input information is made redundant (robust) by two. The constraint length 3 indicates that the convolutional encoder has a total of three nodes, N1, N2, and N3: one input and two flip-flops (FF) 1 and 2. Four data combinations can be held by the two flip-flops 1 and 2: 0 and 0; 0 and 1; 1 and 0; and 1 and 1. Thus, the constraint length 3 can also be expressed as four states.

The generator polynomials G0 and G1 indicate combinations of exclusive OR (EOR) of each node. G0 is the generator polynomial of the output A, and G1 is the generator polynomial of the output B. In the output A, an EOR gate 3 calculates the EOR of three values: the flip-flop 2 in a back row, the flip-flop 1 in a front row, and the input. Thus, the generator polynomial G0 of the output A is 111 (binary). In the output B, an EOR gate 4 calculates the EOR of two values: the flip-flop 1 in the front row and the input. Thus, the generator polynomial G0 of the output A is 101 (binary).

Therefore, in the convolutional encoder shown in FIG. 1, the output is determined by a current input data and the input data of two cycles prior to the current input data. The values held by the flip-flops 1 and 2, namely the internal states of the flip-flops 1 and 2, change due to changes in data sequences input into the convolutional encoder. Thus, the data sequences of the output A and the output B are determined.

The Viterbi decoding circuit estimates the most probable input data input into the encoder, based on the encoder state and the output data sequence. In the state after a wireless terminal at the transmitting-end is reset and before data is transmitted (time 0), the two flip-flops 1 and 2 of the convolutional encoder are both set to 0. If this state is defined as state 0, the state of the encoder after one cycle is determined according to whether the input data input into the encoder is 0 or 1.

When the input data is 0, state 0 transitions to state 0. If the combination of value a of the output A and value b of the output B, is indicated as {a, b}, {output A, output B}={0, 0}.

Generally, the relationship between the state transition and the output in the convolution encoder shown in FIG. 1 such as that shown in the state transition shown in FIG. 2. As shown in FIG. 2, the convolution encoder shown in FIG. 1 transitions the states of the two flip-flops 1 and 2 while outputting the output A and the output B, whenever data is input. The state transition is expressed in time series as in the trellis diagram shown in FIG. 3. Although only the state transition between time 0 and time 1 is shown in FIG. 3, the topology is the same for state transitions following time 1.

As shown in FIG. 3, the state changes to state 0 at time 1 when either a transition from state 0 at time 0 (upper branch) or a transition from state 1 at time 0 (lower branch) is made. Therefore, in the Viterbi decoding circuit at the receiving-end, if the state at time 1 is state 0, the state is expected to be state 0 at time 0 and the reception signal, namely the output signal from the wireless terminal at the transmitting-end, {0, 0}, or the state is expected to be state 1 at time 0 and the output signal from the transmitting-end, {1, 1}.

The Viterbi decoding circuit calculates the distance between the two expected values (hereinafter, "Data A candidate" and "Data B candidate") and the actual reception signals (hereinafter, "Data A" and "Data B"), namely a branch metric, according to Equation 1.

$$\text{Branch metric} = |\text{Data } A - \text{Data } A \text{ candidate}| + |\text{Data } B - \text{Data } B \text{ candidate}| \quad (1)$$

The Viterbi decoding circuit assigns the smaller of the upper branch metric obtained from the upper branch and the lower branch metric obtained from the lower branch to a path metric as a surviving branch. The surviving branch is similarly determined for time 2 and later, and the surviving branches are added to the path metric. Ultimately, [number of reception data×4 states] surviving branches and four path metrics are acquired.

The path metric is equivalent to the total distance (evaluation coefficient) of a trellis path. Based on the path metric, if the trellis path is traced back in the order opposite of the receiving order, the most probable transmission data sequence with the least amount of errors can be estimated. FIG. 4 is a block diagram of a conventional Viterbi decoding circuit that performs maximum likelihood estimation. A branch metric calculating unit 5 calculates the branch metric. An add-compare-select (ACS) unit 6 determines the path metric. A path memory unit 7 holds the surviving branch. A trace back unit 8 reads the surviving branch held in the path memory unit 7, traces back the trellis path, and decodes the transmission data sequence.

The inventors of the present invention previously filed applications for semi-fixed circuits that can operate as plural types of scramblers or descramblers (for example, Japanese Patent Laid-Open Publication No. 2005-101753). The semi-fixed circuits include a plurality of flip-flops that can be connected serially, a first selector that can select at least one signal among an exclusive OR signal of an input signal and a first feedback signal, the feedback signal, and the input signal and output a first flip-flop among the flip-flops, and a second selector that can select at least one from signal from an exclusive OR signal of an output signal from a second flip-flop among the flip-flops and a second feedback signal, the output signal from the second flip-flop, and the second feedback signal and can output the selected signal to the first selector as the first feedback signal.

However, in the conventional Viterbi decoding circuit, parameters (1) to (3) are fixed. The wireless technologies differ between, for example, the wireless LAN and the third generation mobile phone, and thus, the parameters (1) to (3) also differ. Therefore, the Viterbi decoding circuit for the wireless LAN cannot be used in the third generation mobile phone. To make a wireless device compliant with a various wireless technology types, the wireless device must have a Viterbi decoding circuit for each wireless technology.

In other words, to make a wireless device compatible with, for example, a wireless LAN based on IEEE802.11a, a wireless LAN based on IEEE802.11b, a third generation mobile phone based on a wideband code division multiple access (WCDMA), a digital broadcasting based on integrated service digital broadcasting terrestrial (ISDB-T), which is same as the wireless LAN based on IEEE802.11a, and an short-range radio based on IEEE802.15, the wireless device must have at least five types of Viterbi circuits because there are two types of WCDMA standards. This makes a size of the circuit performing the Viterbi decoding large. The size of the circuit further increases with every additional wireless technology.

Thus, the Viterbi circuit may be configured using a field programmable gate array (FPGA), which is a device in which logic components can be changed within a field. The Viterbi circuit can be made compatible with each wireless technology by changing FPGA settings. However, to change the FPGA setting information, a few hundred milliseconds are required. Assuming an application in which the wireless system is switched during voice communication, the switching of the wireless system must be completed within a few ten seconds. Therefore, the FPGA is not suitable.

Moreover, required memory capacity increases due to the large amount of information for FPGA settings, resulting in increasing the circuit area. Furthermore, it is difficult to make the FPGA settings in accordance with the desired wireless technology, unless made by an engineer familiar with the Viterbi decoding technology. In addition, the FPGA setting is complicated because the information differs with each wireless technology. Although Japanese Patent Laid-Open Publication No. 2005-101753 discloses the concept of the Viterbi decoding circuit configuration using the semi-fixed circuit, details of the configuration are not mentioned.

SUMMARY OF THE INVENTION

It is an object of the present invention to at least solve the above problems in the conventional technologies.

A Viterbi decoding circuit according to one aspect of the present invention includes a setting register in which parameters are changeably set according to a type of wireless communication standard, the parameters including a code rate, a constraint length, and a generator polynomial; a branch metric calculating unit configured to calculate a branch metric of an input signal and to generate branch metric information in an amount according to the code rate; a replica generating unit configured to replicate, based on the generator polynomial, a specification of an encoder at a transmitting-end, and to generate setting information related to selection of the branch metric information; a branch metric selection unit configured to perform selection of an upper branch metric and a lower branch metric from among a plurality of pieces of the branch metric information, based on the setting information; an add-compare-select unit configured to determine a path metric for each step in a trellis diagram based on the upper branch metric and the lower branch metric, and to determine a surviving branch and a path metric value; a path memory unit configured to store the surviving branch and the path metric value; and a trace back unit configured to read out the surviving branch from the path memory unit, and to determine the shortest path metric by tracing back a trellis path in the trellis diagram.

A wireless device according to another aspect of the present invention includes the Viterbi decoding circuit according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a table of parameters in the Viterbi decoding circuit for each wireless technology;

FIG. 12 is a schematic for illustrating a relationship between feedback output destinations and feedback output sources of ACS calculators when the number of states is 64;

FIG. 14 is a schematic for illustrating a relationship between a feedback output destination and a feedback output source of ACS calculators when the number of states is 256;

DETAILED DESCRIPTION OF THE PREFERRED EMBODIMENTS

Exemplary embodiments according to the present invention will be explained in detail with reference to the accompanying drawings. The present invention is not limited by the embodiments.

Figure 5:
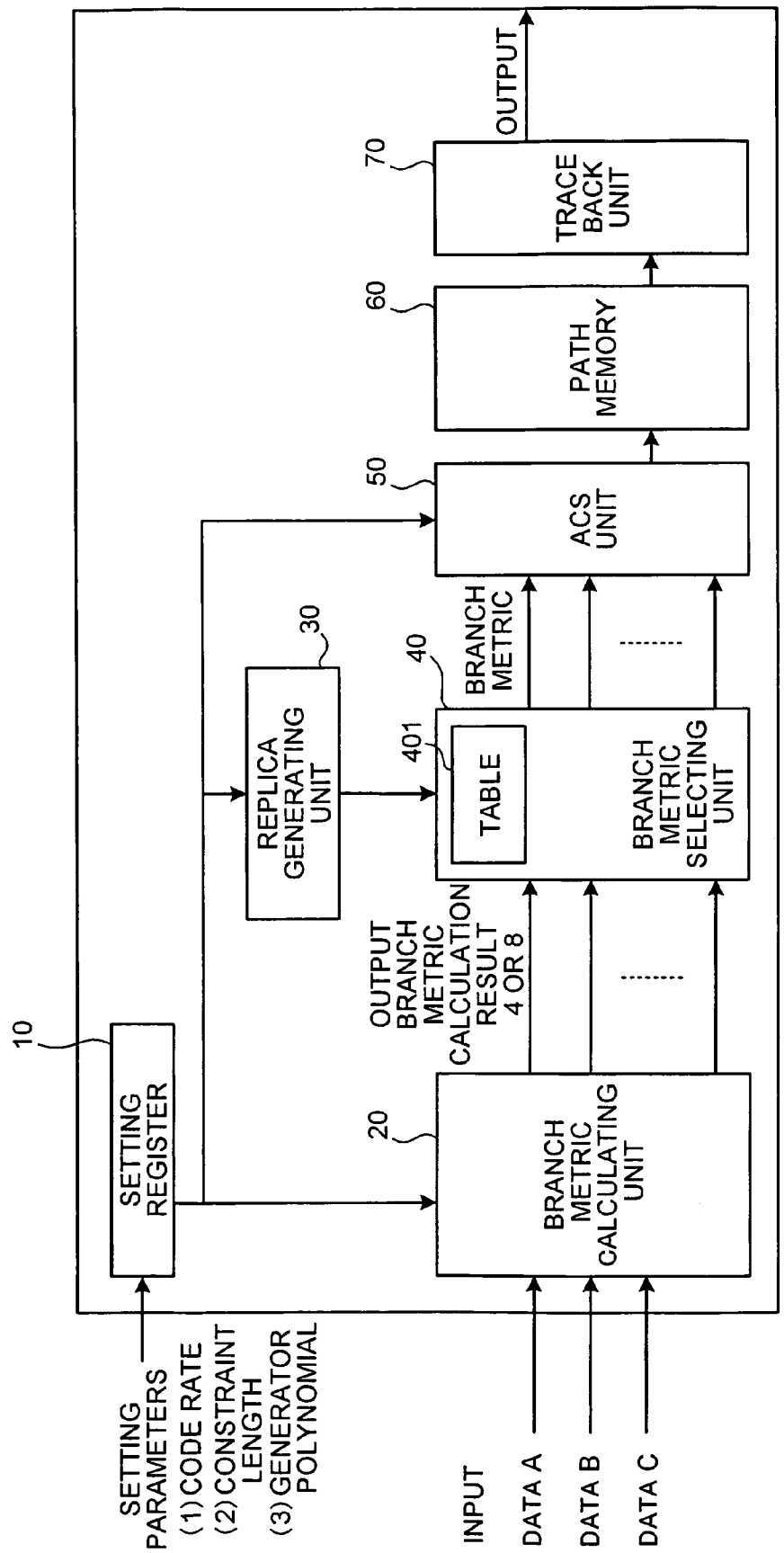
FIG. 5 is a block diagram of a Viterbi decoding circuit according to an embodiment of the present invention.

FIG. 5 is a block diagram of a Viterbi decoding circuit according to an embodiment of the present invention. As shown in FIG. 5, the Viterbi circuit includes a setting register 10, a branch metric calculating unit 20, a replica generating unit 30, a branch metric selecting unit 40 including a table (memory) 401, an ACS unit 50, a path memory unit 60, and a trace back unit 70. The setting register 10 is composed of a memory in which three types of parameters, (1) a code rate, (2) a constraint length (number of states), and (3) generator polynomials, can be set freely according to a wireless technology. The parameters set in the setting register (10) are provided to the branch metric calculating unit 20, the replica generating unit 30, and the ACS unit 50.

The branch metric calculating unit 20 calculates a branch metric according to Equation 1, based on the code rate and the constraint (number of states) provided by the setting register 10. When the code rate is ½, if the combination of a value c of the Data A candidate and the value d of the Data B candidate is expressed as {c, d}, the branch metric calculating unit 20 calculates the branch metrics of four combinations, {0, 0}, {0, 1}, {1, 0}, and {1, 1}, for the two inputs of the actual reception signals Data A and Data B. The branch metric calculating unit 20 then outputs the calculated results.

When the code rate is ⅓, if the combination of the value c of the Data A candidate, the value d of the Data B candidate, and a value e of the Data C candidate is expressed as {c, d, e}, the branch metric calculating unit 20 calculates the branch metrics of eight combinations, {0, 0, 0}, {0, 0, 1}, {0, 1, 0}, {0, 1, 1}, {1, 0, 0}, {1, 0, 1}, {1, 1, 0}, and {1, 1, 1}, for the three inputs of the actual reception signals Data A, Data B and Data C. The branch metric calculating unit 20 then outputs the calculated results.

$$\text{Branch metric} = |\text{Data } A - \text{Data } A \text{ candidate}| + |\text{Data } B - \text{Data } B \text{ candidate}| + |\text{Data } C - \text{Data } C \text{ candidate}| \qquad (2)$$

The replica generating unit 30 replicates specifications of an encoder at a transmitting-end based on the generator polynomials provided by the setting register 10 and generates setting information related to a branch metric selection circuit (not shown) within the branch metric selecting unit 40. The branch metric selecting unit 40 holds the setting information outputted from the replica generating unit 30, selects suitable branch metrics among the branch metrics output from the branch metric calculating unit 20, and outputs the selected branch metrics to the ACS unit 50.

The ACS unit 50 determines a path metric for each step in a trellis diagram based on the branch metrics received from the branch metric selecting unit 40 and outputs a surviving branch metric and a path metric value to the path memory unit 60. At this time, the path memory unit 60 changes the calculation frequency according to the constraint length (number of states) provided by the setting register 10.

The path memory unit 60 holds the surviving branch and the path metric value received from the ACS unit 50. The trace back unit 70 decodes a transmission data sequence by reading out the surviving branch held in the path memory unit 60 while tracing back a trellis path and determining the shortest path metric. The path memory unit 60 and the trace back unit 70 are the same as those in the conventional Viterbi decoding circuit, and thus, detailed explanations thereof are omitted.

FIG. 6 is a table of three types of parameters in the Viterbi decoding circuit for wireless communication standards in common use. As shown in FIG. 6, when a wireless LAN based on IEEE802.11a and a digital broadcasting based on ISDB-T is used, the code rate is ½, the generator polynomials G0 and G1 are 1011011 (binary) and 1111001 (binary), respectively, and the constraint length is 7 (64). The value within the parentheses of the constraint length is the number of states. If a wireless LAN based on IEEE802.11b is used, the code rate is ½, the generator polynomials G0 and G1 are 1011011 (binary) and 1111101 (binary), respectively, and the constraint length is 7 (64).

When a third generation mobile phone based on WCDMA is used, there is a first standard in which the code rate is ½, the generator polynomials G0 and G1 are 101110001 (binary) and 111101011 (binary), respectively, and the constraint length is 9 (256), and a second standard in which the code rate is ⅓, the generator polynomials G0, G1, and G2 are 101101111 (binary), 110110000 (binary), and 111001001 (binary), respectively, and the constraint length is 9 (256). The generator polynomial G2 is set when three combinations of the exclusive OR of each node in the encoder at the transmitting-end are configured. When a short-range radio based on IEEE802.15 is used, the code rate is ⅓, the generator polynomials G0, G1, and G2 are 1011011 (binary), 1110101 (binary), and 1111001 (binary), respectively, and the constraint length is 7 (64).

Figure 7:
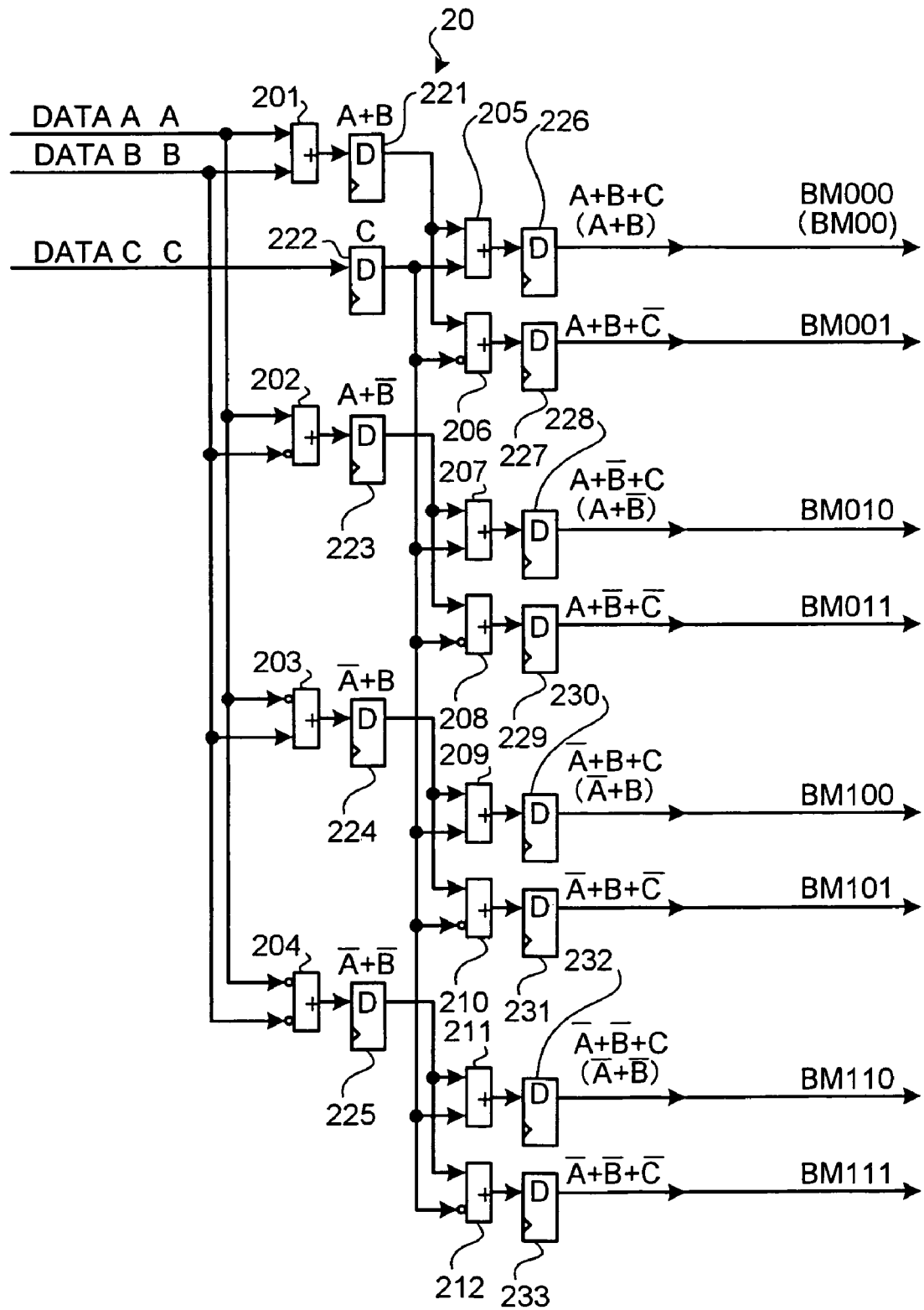
FIG. 7 is a schematic of a branch metric calculating unit.

The explanation hereafter focuses on when the code rate is ⅓. FIG. 7 is a schematic of the branch metric calculating unit. The while circle on the inputs of the adders shown in FIG. 7 indicates subtraction due to inversion of the positive and negative polarities of the input signal input thereto. As shown in FIG. 7, the branch metric calculating unit 20 includes, for example, 12 adders 201 to 212 and 13 flip-flops 221 to 233.

The adder 201 adds Data A and Data B. The flip-flop 221 latches the output from the adder 201 and outputs the latched output synchronously with a clock. The flip-flop 222 latches Data C and outputs the latched output synchronously with the clock. The adder 205 adds the output from the flip-flop 221 and the output from the flip-flop 222. The flip-flop 226 latches the output from the adder 205 and outputs the latched output synchronously with the clock.

The output from the flip-flop 226 is the branch metric values of Data A, Data B, and Data C, and the Data A candidate, the Data B candidate, and the Data C candidate, when the Data A candidate, the Data B candidate, and the Data C candidate are 0, 0, and 0, respectively. This output is branch metric information BM000.

The adder 206 adds the output from the flip-flop 221 and the inversed value of the output from the flip-flop 222. The flip-flop 227 latches the output of the adder 206 and outputs the latched output synchronously with the clock. The output of the flip-flop 227 is the branch metric values when the Data A candidate, the Data B candidate, and the Data C candidate are 0, 0, and 1, respectively. This output is branch metric information BM001.

The adder 202 adds Data A and the inversed value of Data B. The flip-flop 223 latches the output from the adder 202 and outputs the latched output synchronously with the clock. The adder 207 adds the output from the flip-flop 223 and the output from the flip-flop 222. The flip-flop 228 latches the output from the adder 207 and outputs the latched output synchronously with the clock. The output from the flip-flop 228 is the branch metric values when the Data A candidate, the Data B candidate, and the Data C candidate are 0, 1, and 0, respectively. This output is branch metric information BM010.

The adder 208 adds the output from the flip-flop 223 and the inversed value of the output from the flip-flop 222. The flip-flop 229 latches the output from the adder 208 and outputs the latched output synchronously with the clock. The output from the flip-flop 229 is the branch metric values when the Data A candidate, the Data B candidate, and the Data C candidate are 0, 1, and 1, respectively. This output is branch metric information BM011.

The adder 203 adds the inversed value of Data A and Data B. The flip-flop 224 latches the output from the adder 203 and outputs the latched output synchronously with the clock. The adder 209 adds the output from the flip-flop 224 and the output from the flip-flop 222. The flip-flop 230 latches the output from the adder 209 and outputs the latched output synchronously with the clock. The output from the flip-flop 230 is the branch metric values when the Data A candidate, the Data B candidate, and the Data C candidate are 1, 0, and 0, respectively. This output is branch metric information BM100.

The adder 210 adds the output from the flip-flop 224 and the inversed value of the output from the flip-flop 222. The flip-flop 231 latches the output from the adder 210 and outputs the latched output synchronously with the clock. The output from the flip-flop 231 is the branch metric values when the Data A candidate, the Data B candidate, and the Data C candidate are 1, 0, and 1, respectively. This output is branch metric information BM101.

The adder 204 adds the inversed value of Data A and the inversed value of Data B. The flip-flop 225 latches the output from the adder 204 and outputs the latched output synchronously with the clock. The adder 211 adds the output from the flip-flop 225 and the output from the flip-flop 222. The flip-flop 232 latches the output from the adder 211 and outputs the latched output synchronously with the clock. The output from the flip-flop 232 is the branch metric values when the Data A candidate, the Data B candidate, and the Data C candidate are 1, 1, and 0, respectively. This output is branch metric information BM110.

The adder 212 adds the output from the flip-flop 225 and the inversed value of the output from the flip-flop 222. The flip-flop 233 latches the output from the adder 212 and outputs the latched output synchronously with the clock. The output from the flip-flop 233 is the branch metric values when the Data A candidate, the Data B candidate, and the Data C candidate are 1, 1, and 1, respectively. This output is branch metric information BM111.

The explanation above is for when the code rate is ⅓. When the code rate is ½, the value of Data C is fixed to 0 within the branch metric calculating unit 20. Whether to input Data C into the branch metric calculating unit 20 as a reception signal from an external source or to fix Data C to 0 within the branch metric calculating unit 20 is selected by a selector (not shown), based on the value of the code rate. When the value of Data C is fixed to 0, the branch metric information BM000 is equivalent to the branch metric values of Data A and Data B and the Data A candidate and the Data B candidate when the Data A candidate and the Data B candidate are 0 and 0, respectively. This output is branch metric information BM00.

Similarly, the branch metric BM010 is equivalent to the branch metric values when the Data A candidate and the Data B candidate are 0 and 1, respectively. This output is branch metric information BM01. The branch metric BM100 is equivalent to the branch metric values when the Data A candidate and the Data B candidate are 1 and 0, respectively. This output is branch metric information BM10. The branch metric BM110 is equivalent to the branch metric values when the Data A candidate and the Data B candidate are 1 and 1, respectively. This output is branch metric information BM11.

Figure 8:
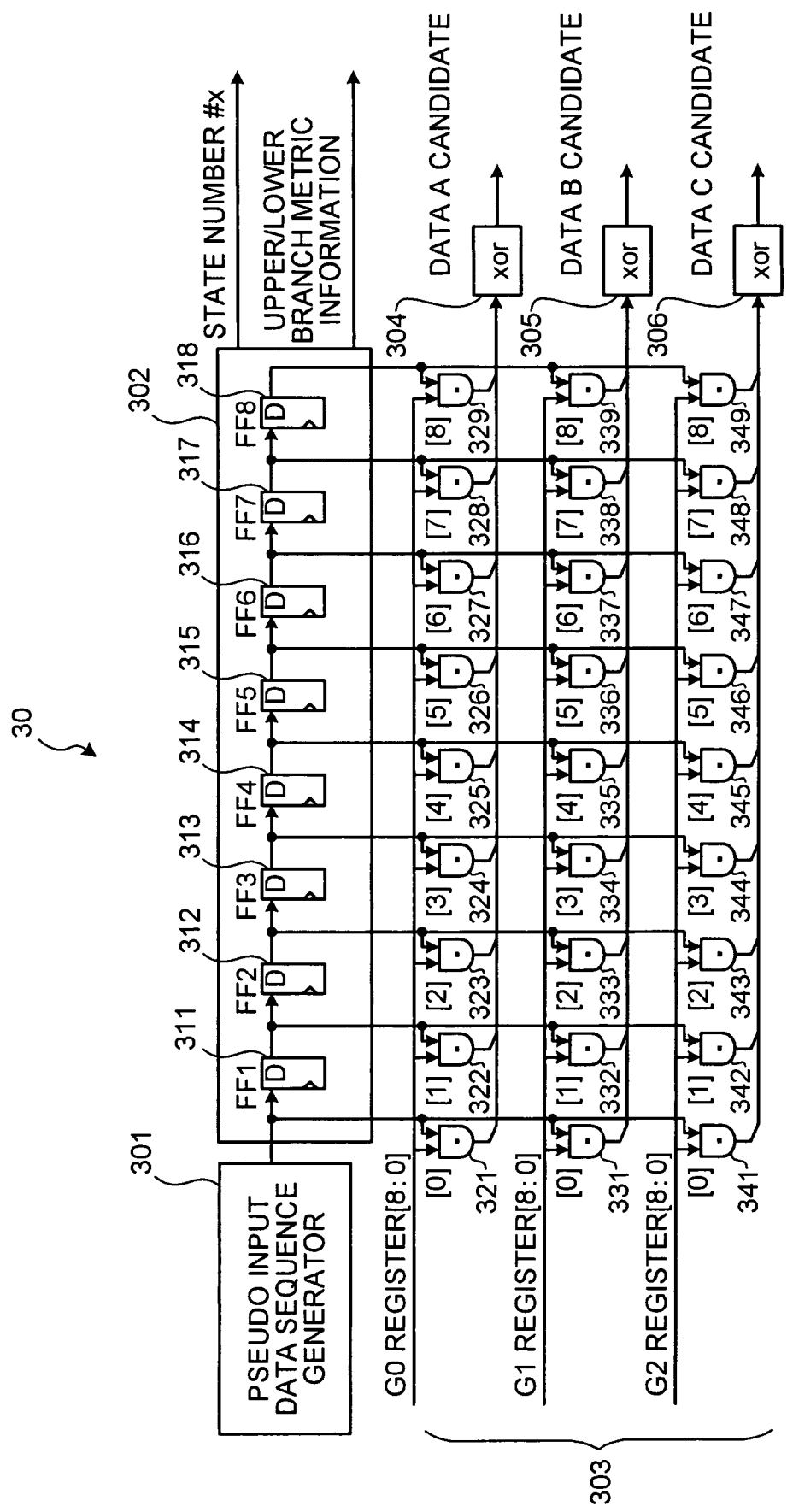
FIG. 8 is a schematic of a replica generating unit.

FIG. 8 is a schematic of the replica generating unit. As shown in FIG. 8, the replica generating unit 30 includes a pseudo input data sequence generator 301, a pseudo input data sequence setting unit 302, an AND gate group 303 that is, for example, a 3×4 matrix, and three exclusive OR calculators 304 to 306. The pseudo input data sequence generator 301 sequentially generates pseudo data 0_0000_0000 (binary) to 1_1111_1111 (binary) with 0_0000_0000 (binary) as the initial state. The pseudo input data sequence setting unit 302 includes shift registers composed of, for example, eight flip-flops 311 to 318.

Here, the eight flip-flops 311 to 318 that configure the shift register are aligned in order, starting from the flip-flop with the smallest reference numeral, from the pseudo input data sequence generator 301 side. With regards to the AND gate group 303, nine AND gates 321 to 329 in the first row, nine AND gates 321 to 329 in the second row, and nine AND gates 331 to 339 in the third row are also aligned in the same way.

The pseudo data generated by the pseudo input data sequence generator 301 is set in the shift register of the pseudo input data sequence setting unit 302. The output from the flip-flop 312 in the first row is input into the flip-flop 312 in the next row, and at the same time, becomes one input of the AND gate 321 in the first column of the first row, the AND gate 331 in the first column of the second row, and the AND gate 341 in the first column of the third row. The same applies to the second columns and subsequent columns.

The other input of the AND gates 321 to 329 in the first row is the value of each bit of the generator polynomial G0, of which the AND gate 321 in the first column is the least significant bit (LSB). The other input of the AND gates 331 to 339 in the second row is the value of each bit of the generator polynomial G1, of which the AND gate 331 in the first column is the LSB. The other input of the AND gates 341 to 349 in the third row is the value of each bit of the generator polynomial G2, of which the AND gate 341 in the first column is the LSB. However, when the code rate is ½, the AND gates 341 to 349 in the third row are not used because there is no generator polynomial G2. For example, an explanation of when IEEE802.15 short-range radio is used is as follows.

The generator polynomial G0 is 1011011 (binary) (see FIG. 6). Therefore, in the first row, 1, 1, 0, 1, 1, 0, and 1 are input into the AND gate 321 in the first column, the AND gate 322 in the second column, the AND gate 323 in the third column, the AND gate 324 in the fourth column, the AND gate 325 in the fifth column, the AND gate 326 in the sixth column, and the AND gate 327 in the seventh column, respectively. 0 is input into the AND gate 328 in the eighth column and the AND gate 329 in the ninth column, respectively.

The generator polynomial G1 is 1110101 (binary) (refer to FIG. 6). Therefore, in the second row, 1, 0, 1, 0, 1, 1, and 1 are input into the AND gate 331 in the first column, the AND gate 332 in the second column, the AND gate 333 in the third column, the AND gate 334 in the fourth column, the AND gate 335 in the fifth column, the AND gate 336 in the sixth column, and the AND gate 337 in the seventh column, respectively. 0 is input into the AND gate 338 in the eighth column and the AND gate 339 in the ninth column, respectively.

The generator polynomial G2 is 1111001 (binary) (refer to FIG. 6). Therefore, in the third row, 1, 0, 0, 1, 1, 1, and 1 are input into the AND gate 341 in the first column, the AND gate 342 in the second column, the AND gate 343 in the third column, the AND gate 344 in the fourth column, the AND gate 345 in the fifth column, the AND gate 346 in the sixth column, and the AND gate 347 in the seventh column, respectively. 0 is input into the AND gate 348 in the eighth column and the AND gate 349 in the ninth column, respectively.

The exclusive OR calculator 304 performs the exclusive OR operation of each output from the AND gates 321 to 329 in the first column and outputs the calculated results as the Data A candidate. The exclusive OR calculator 305 performs the exclusive OR operation of each output from the AND gates 331 to 339 in the second column and outputs the calculated results as the Data B candidate. The exclusive OR calculator 306 performs the exclusive OR operation of each output from the AND gates 341 to 349 in the third column and outputs the calculated results as the Data C candidate. However, the Data C candidate is invalid when the code rate is ½.

The pseudo input data sequence setting unit 302 outputs a state number #x (x is, for example, integers 0 to 63) indicating the internal state of the encoder at the transmitting-end and upper/lower branch metric information that is information indicating whether a branch metric is an upper branch metric or lower branch metric. If [state number #x<state count/2], the branch metric is an upper branch metric, and in other instances, the branch metric is the lower branch metric.

Figure 1:
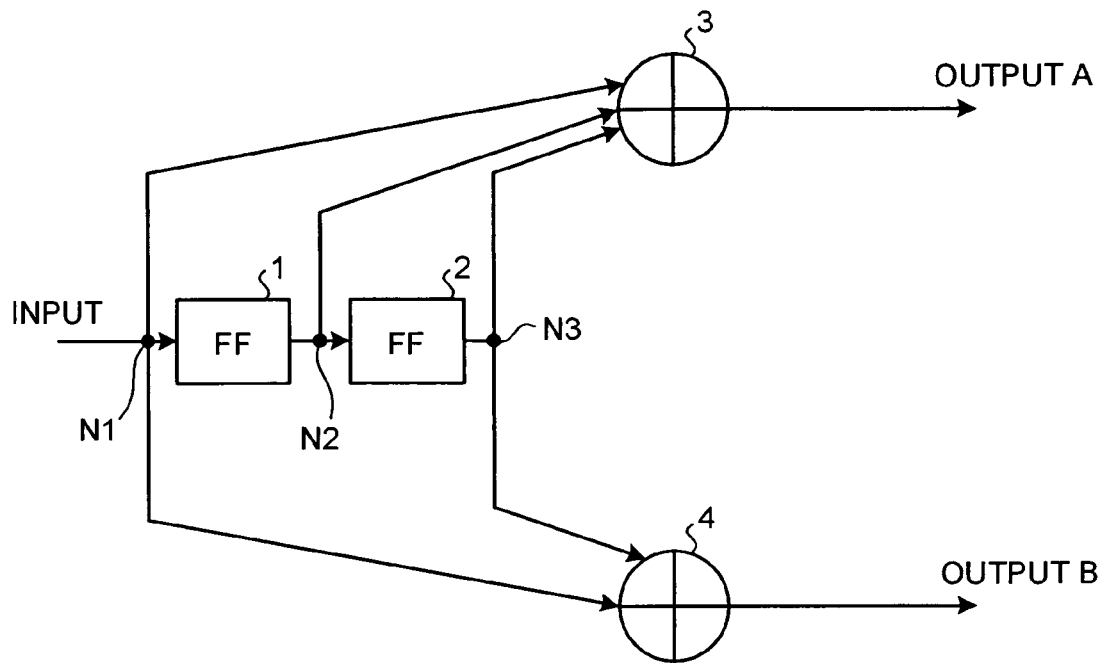
FIG. 1 is a schematic of a convolutional encoder.
Figure 2:
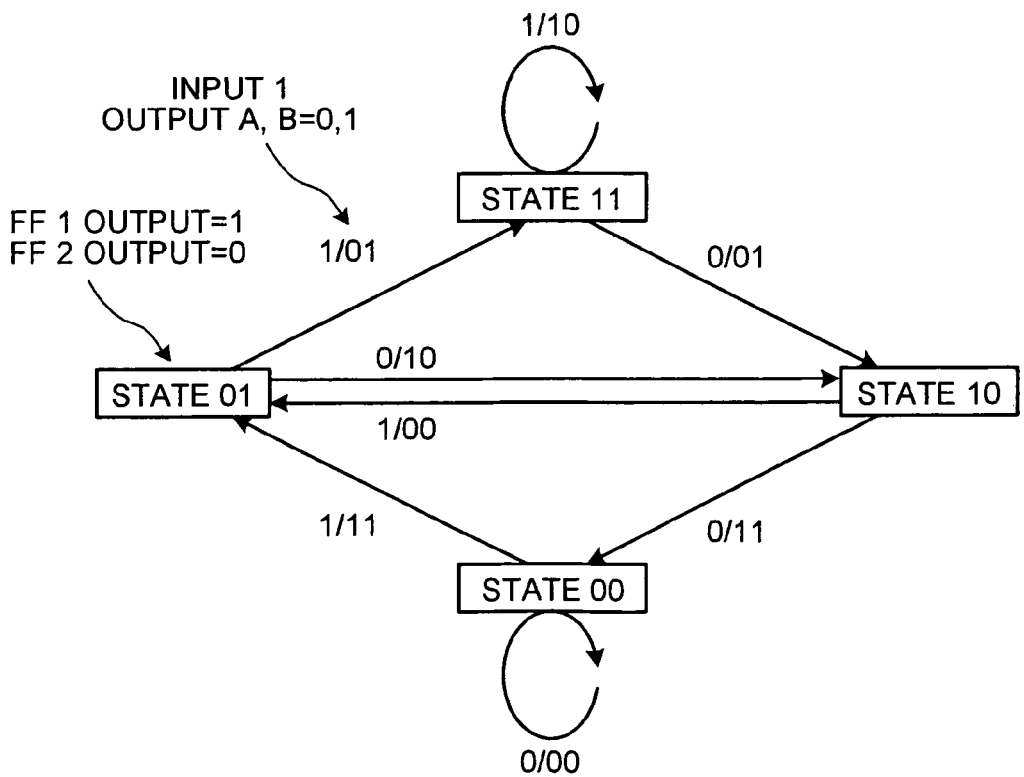
FIG. 2 is a schematic for illustrating a relationship between a state transition and an output of the convolutional encoder shown in FIG. 1.
Figure 3:
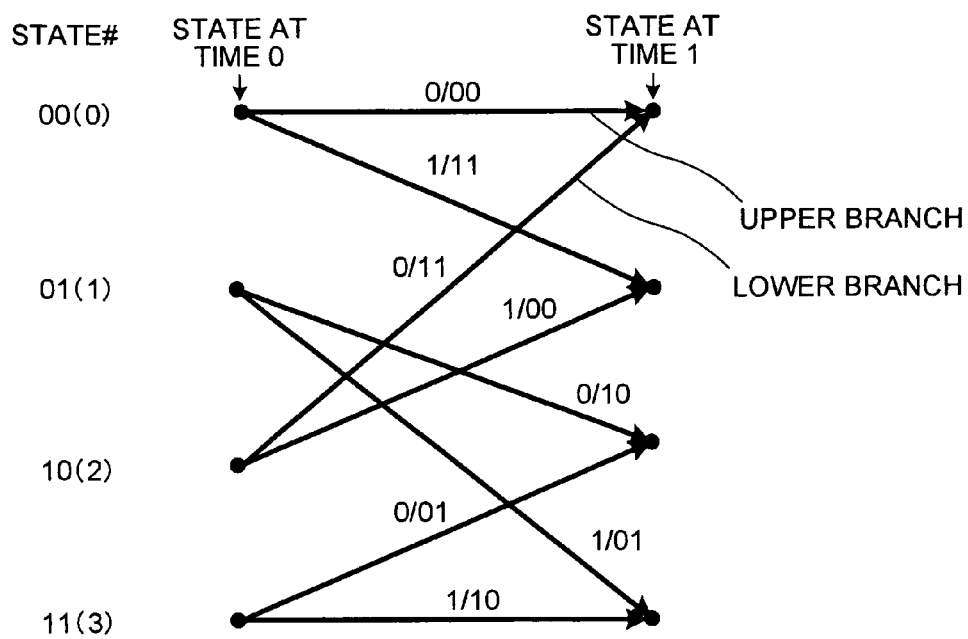
FIG. 3 is a trellis diagram in which the state transition shown in FIG. 2 is expressed in time series.
Figure 4:
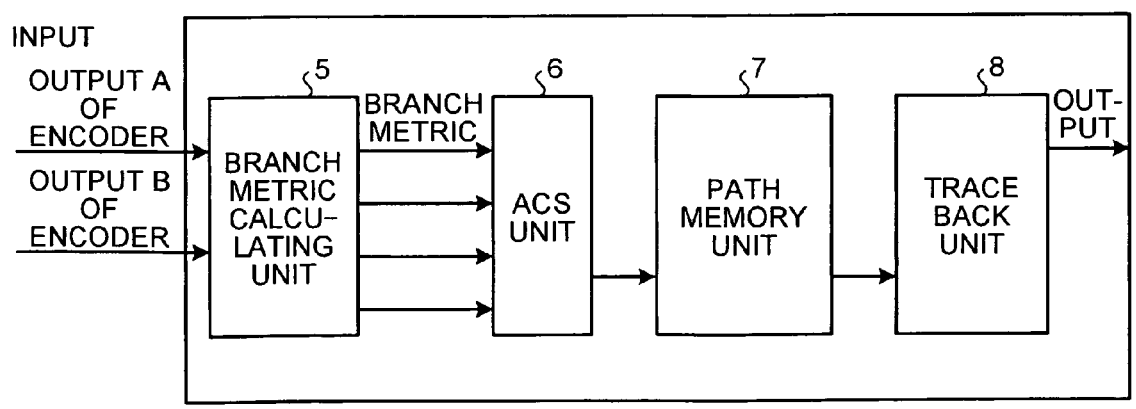
FIG. 4 is a schematic of a conventional Viterbi decoding circuit.

In this way, the replica generating unit 30 sets G0 to G2 (G0 and G1 when the code rate is ½) and sequentially generates the pseudo data from the initial state of 0_0000_0000 (binary) to 1_1111_11111 (binary), thereby replicating the specifications of the encoder at the transmitting-end. In addition, the internal state of the encoder (state number #x), whether the branch metric is the upper branch metric or the lower branch metric, and the output symbol of the encoder (Data A candidate, Data B candidate, and Data C candidate) are obtained. Because the replica generating unit 30 has functions such as those explained above, for example, topology information such as that shown in FIG. 3 can be mapped to the interconnection information of the Viterbi decoding circuit.

Figure 9:
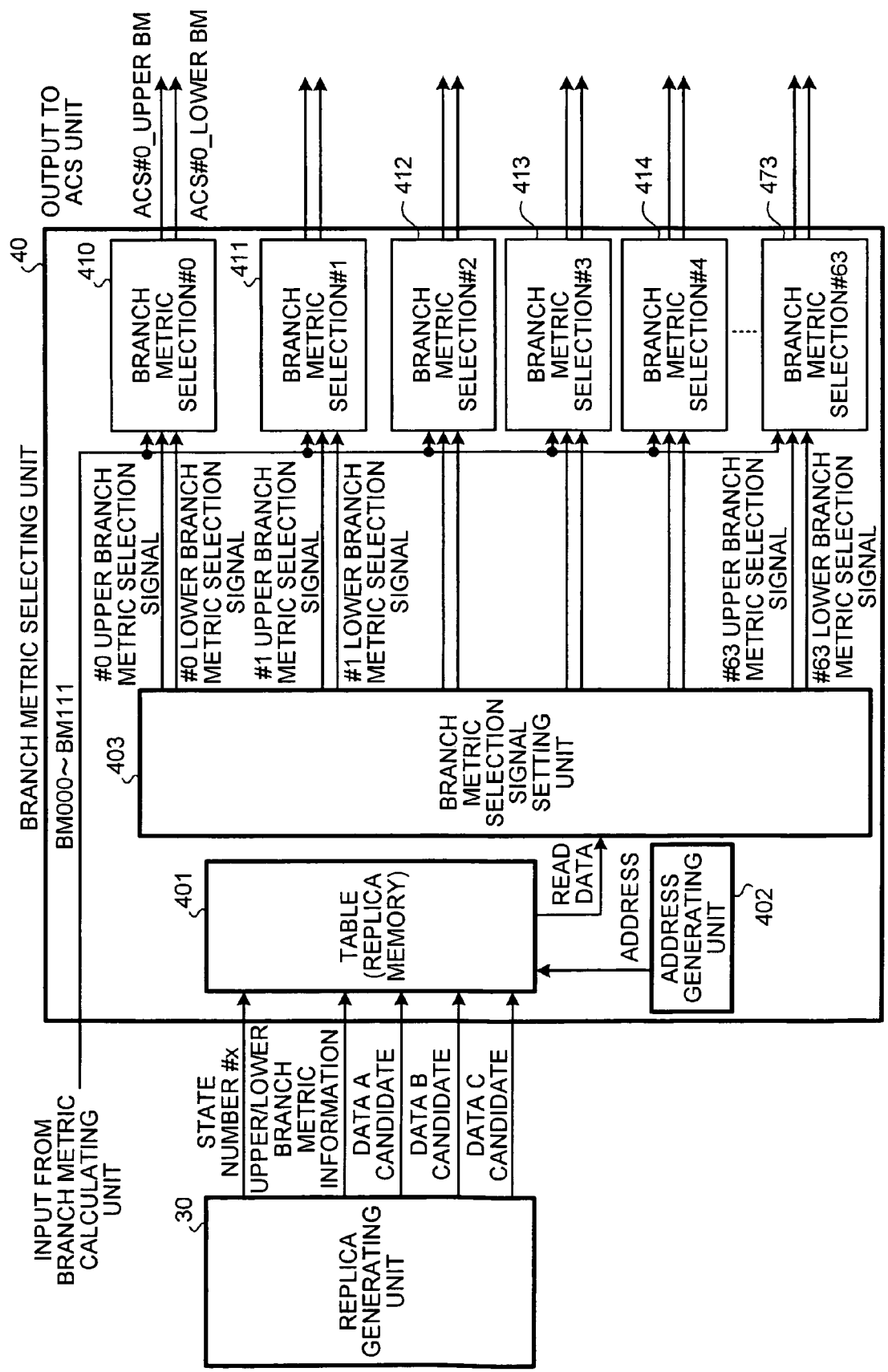
FIG. 9 is a schematic of a branch metric selecting unit.

FIG. 9 is a schematic of the branch metric selecting unit 40. As shown in FIG. 9, the branch metric selecting unit 40 includes a table 401, an address generating unit 402, a branch metric selection signal setting unit 403, and, although the quantity is not particularly limited thereto, for example, 64 branch metric selection circuits 410 to 414, and 473 (only six are shown in the diagram).

The table 401 is composed of memory (replica memory). The table 401 temporarily stores the specifications of the encoder at the transmitting-end, namely the state number #x, the upper/lower branch metric information, the Data A candidate, the Data B candidate, and the Data C candidate, acquired from the replica generating unit 30. When the code rate is ½, the table 401 does not store the Data C candidate. When the constraint length is 7 (64 states), the table 401 stores double the amount of specifications for 64 states, namely 128 branches worth. When the constraint length is 9 (256 states), the table 401 stores 512 branches worth (double the 256 states) of specifications. Thus, the table 401 has 512 branches worth of capacity, thereby making possible the Viterbi decoding processing of all wireless technologies in FIG. 6.

The address generating unit 402 sequentially generates addresses specifying the branch metric selection circuits 410 to 414, and 473. The generated addresses are provided to the branch metric selection signal setting unit 403, via the table 401. The branch metric selection signal setting unit 403 reads out the specifications of the encoder at the transmitting-end and outputs an upper branch metric selection signal and a lower branch metric selection signal to the branch metric selection circuits 410 to 414, and 473 that is specified by the address.

In addition, each branch metric selection circuit 410 to 414, and 473 receives eight branch metric information BM000 to BM111 from the branch metric calculating unit 20 (four branch metric information BM00 to BM11 when the code rate is ½). Each branch metric selection circuit 410 to 414, and 473 selects one branch metric information from the branch metric information BM000 to BM111 (branch metric information BM00 to BM11 when the code rate is ½), based on the upper branch metric selection signal and the lower branch metric selection signal, respectively, and outputs the selected branch metric information as the upper branch metric (ACS#x_upperBM) and the lower branch metric (ACS#x_lowerBM).

Figure 10:
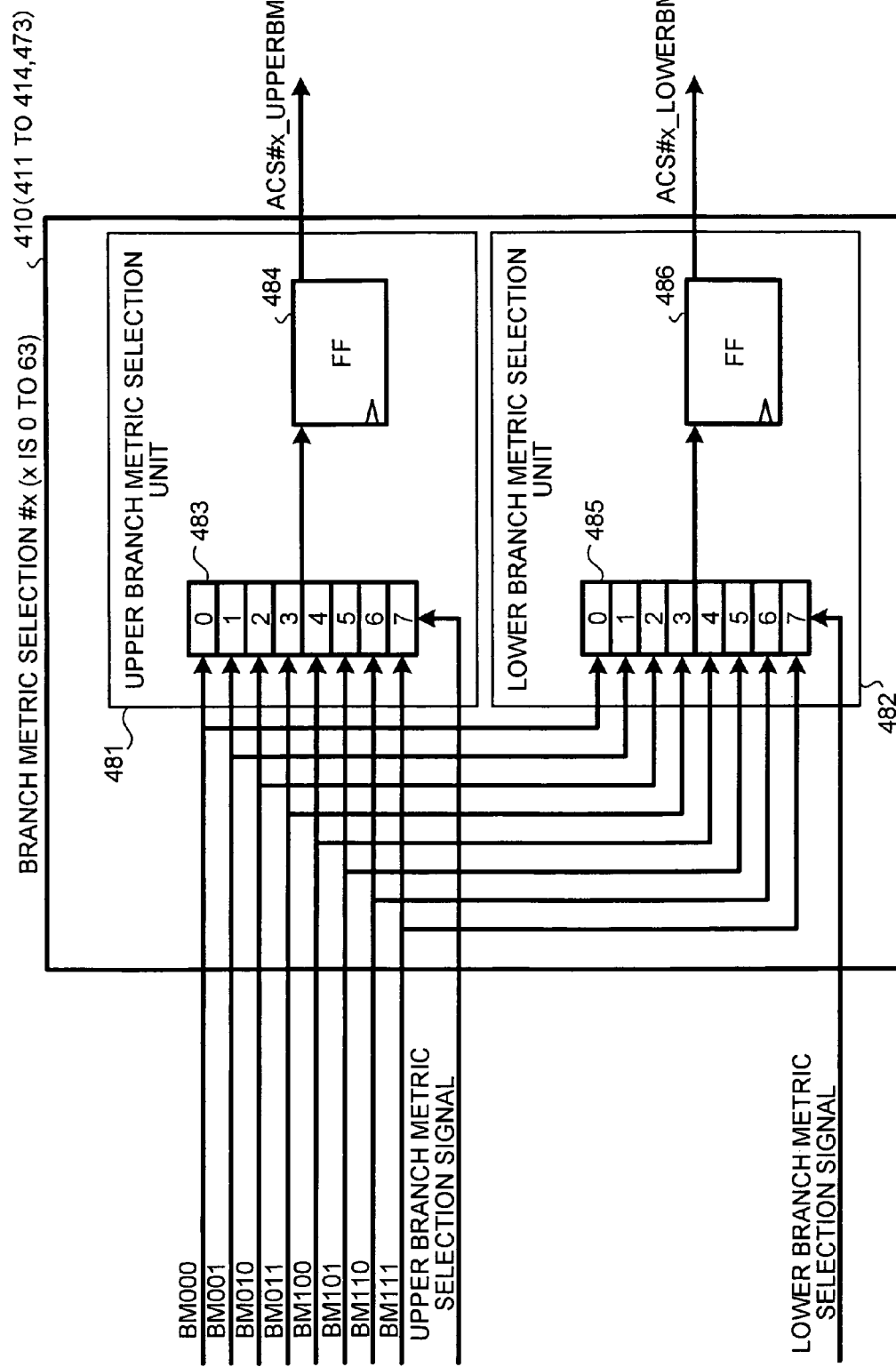
FIG. 10 is a schematic of a branch metric selection circuit.

FIG. 10 is a schematic of the branch metric selection circuit. The configuration of all branch metric selection circuits 410 to 414, and 473 are the same. As shown in FIG. 10, the branch metric selection circuits 410 to 414, and 473 include an upper branch metric selecting unit 481 and a lower branch metric selecting unit 482. A selector 483 having eight inputs and one output and a flip-flop 484 are provided in the upper branch metric selecting unit 481. A selector 485 having eight inputs and one output and a flip-flop 486 are provided in the upper branch metric selecting unit 482.

When the code rate is ⅓, the selector 483 selects the branch metric information BM000, BM001, BM010, BM011, BM100, BM101, BM110, and BM111, respectively, among the eight branch metric information BM000 to BM111, when the Data A candidate, the Data B candidate, and the Data C candidate are [0, 0, 0], [0, 0, 1], [0, 1, 0], [0, 1, 1], [1, 0, 0], [1, 0, 1], [1, 1, 0], and [1, 1, 1]. The flip-flop 484 latches the output from the selector 483, and outputs the latched output as the upper branch metric (ACS#x_upperBM) that is synchronous with the clock.

In addition, the selector 485 selects the branch metric information BM000, BM001, BM010, BM011, BM100, BM101, BM110, and BM111, respectively, among the eight branch metric information BM000 to BM111, when the Data A candidate, the Data B candidate, and the Data C candidate are [0, 0, 0], [0, 0, 1], [0, 1, 0], [0, 1, 1], [1, 0, 0], [1, 0, 1], [1, 1, 0], and [1, 1, 1]. The flip-flop 486 latches the output from the selector 485, and outputs the latched output as the upper branch metric (ACS#x_lowerBM) that is synchronous with the clock.

When the code rate is ½, the selector operates as follows. The selector 483 selects the branch metric information BM00, BM01, BM10, and BM11, respectively, among the four branch metric information BM00 to BM11, when the Data A candidate and the Data B candidate are [0, 0], [0, 1], [1, 0], and [1, 1]. The same applies to the selector 485.

Although not particularly limited thereto, when there are 64 states, the branch metric selecting unit 40 outputs 64 pairs of the upper branch metric and the lower branch metric using, for example, 64 branch selecting circuits, branch selecting circuit (#0) 410 that corresponds with the state number #0 to the branch metric selecting circuit (#63) 473 that corresponds with the state number #63. At the same time, when there are 256 states, four branch metric selecting circuits, branch selecting circuit (#0) 410 that corresponds with the state number #0 to the branch metric selecting circuit (#3) 413 that corresponds with the state number #3, are used. Then, the branch metric selection signal setting unit 403 dynamically changes the settings of the four branch metric selecting circuits 410 to 413 64 times, and thus, the branch metric selecting unit 40 outputs 256 pairs of the upper branch metric and the lower branch metric.

Figure 11:
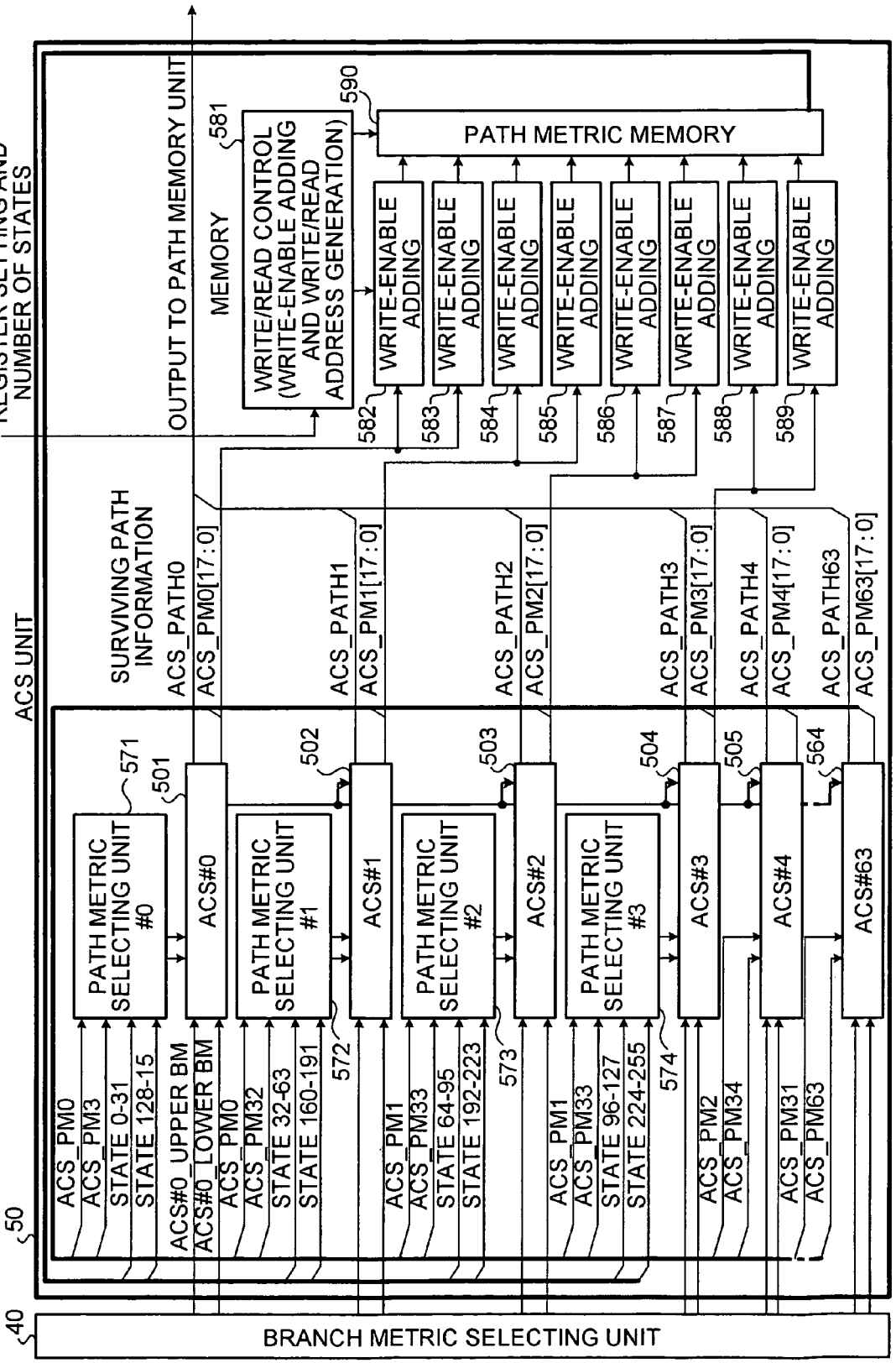
FIG. 11 is a schematic of an add-compare-select (ACS) unit.

FIG. 11 is a schematic of the ACS unit. As shown in FIG. 11, although not particularly limited thereto, the ACS unit 50 includes, for example, 64 ACS calculators 501 to 505, and 564 (only six are shown in the diagram), for example, four path metric selecting units 571 to 574, a path metric memory 590, a memory 581 that controls writing to and reading from the path metric memory 590, and, for example, eight write-enable adding circuits 582 to 589. The path metric memory 590 temporarily holds the path metric values output from the ACS calculator (#0) 501 corresponding to the state number #0, the ACS calculator (#1) 502 corresponding to the state number #1, the ACS calculator (#2) 503 corresponding to the state number #2, and the ACS calculator (#3) 504 corresponding to the state number #3, respectively.

The memory 581 stores the number of states provided by the setting register 10 (refer to FIG. 5) and generates a write-enable signal that allows the path metric value to be written in the path metric memory 590, an address that specifies the destination in the path metric memory 590 to which the path metric value is written, and a read-out address that is used when the path metric value is read out from the path metric memory 590. The write-enable adding circuit 582 to 589 allows the path metric value to be written in the path metric memory 590 when the write-enable signal is asserted. The ACS unit 50 is configured to allow reconfiguration for handling both when the number of states is 64 and when the number of states is 256.

An instance when the number of states is 64 is explained. FIG. 12 is a schematic of a relationship between feedback output destinations and output sources of the ACS calculators when the number of states is 64. As shown in FIG. 12, the output from the ACS calculator (#0) that corresponds with the state number #0 and the output from the ACS calculator (#32) that corresponds with the state number #32 are provided to the input of the ACS calculator (#0) that corresponds to the state number #0 and the input of the ACS calculator (#1) that corresponds to the state number #1.

In addition, the output from the ACS calculator (#0) that corresponds with the state number #0 and the output from the ACS calculator (#33) that corresponds with the state number #33 are provided to the input of the ACS calculator (#2) that corresponds to the state number #2 and the input of the ACS calculator (#3) that corresponds to the state number #3. Generally, the output from the ACS calculator (#(integer part of x/2)) that corresponds with the state number #(integer part of x/2) and the output from the ACS calculator (#(integer part of x/2+number of states/2)) that corresponds with the state number # (integer part of x/2+state count/2) are provided to the input of the ACS calculator (#x) that corresponds to the state number #x.

Figure 13:
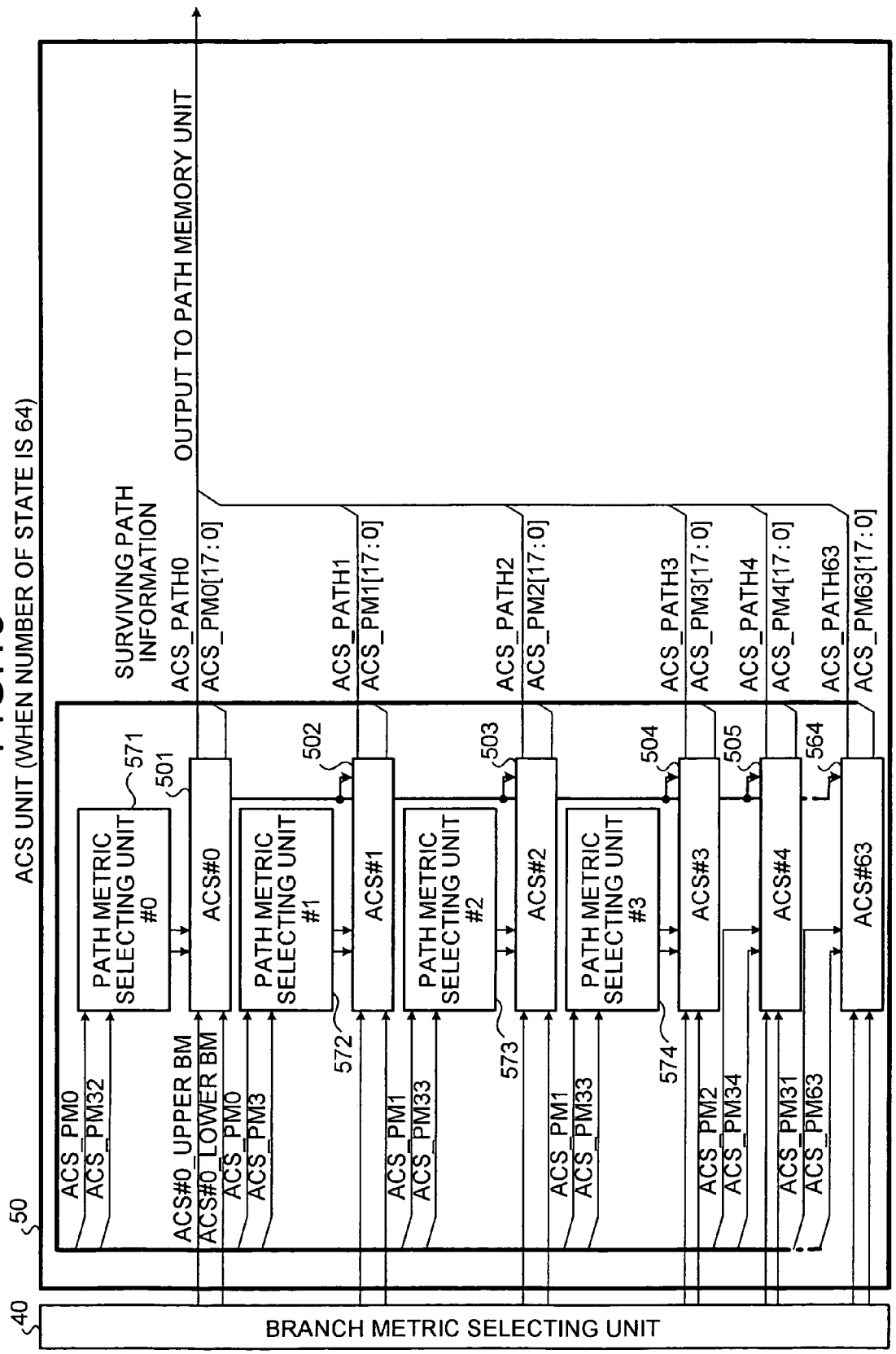
FIG. 13 is a schematic of an ACS unit that is reconfigured based on the relationship shown in FIG. 12.

FIG. 13 is a schematic of an ACS unit that is reconfigured based on the relationships shown in FIG. 12. As shown in FIG. 13, using all 64 ACS calculators 501 to 505, and 564 and feeding back the outputs thereof, each ACS calculator 501 to 505, and 564 performs ACS calculations. 64 states can be actualized through the use of, for example, 32 calculators that is half, 16 calculators that is ¼, 8 calculators that is ⅛, or 4 calculators that is 1/16 of the 64 ACS calculators 501 to 505, and 564, to perform ACS calculations at a time-interval.

An instance when the number of states is 256 is explained. FIG. 14 is a schematic of a relationship between the feedback output destinations and the output sources of the ACS calculator when the number of states is 256. As shown in FIG. 14, the output from the ACS calculator (#(integer part of x/2)) that corresponds with the state number #(integer part of x/2) and the output from the ACS calculator (#(integer part of x/2+state count/2)) that corresponds with the state number #(integer part of x/2+state count/2) are provided to the input of the ACS calculator (#x) that corresponds to the state number #x, as are when the number of states is 64. Although the relationships from the state number #1 to the state number #63 are shown in FIG. 14, the same relationship is developed until the state number #256 in practice.

Figure 15:
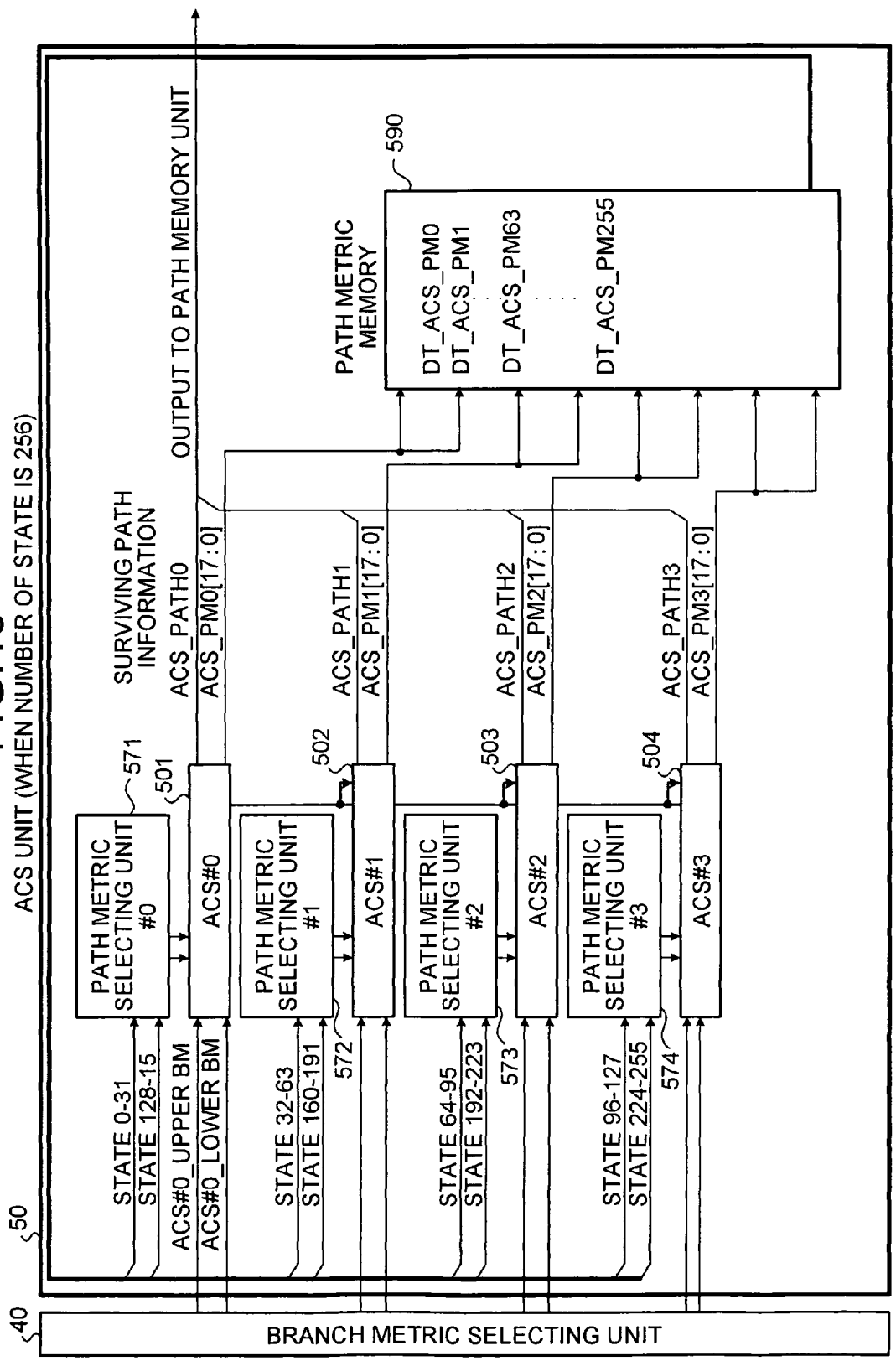
FIG. 15 is a schematic of an ACS unit that is reconfigured based on the relationship shown in FIG. 14.

FIG. 15 is a schematic of an ACS unit that is reconfigured based on the relationships shown in FIG. 14. As shown in FIG. 15, the ACS calculator (#0) 501 that corresponds with the state number #0, the ACS calculator (#1) 502 that corresponds with the state number #1, the ACS calculator (#2) 503 that corresponds with the state number #02, the ACS calculator (#3) 504 that corresponds with the state number #3 are used. As explained above, the relationships between the feedback output destination and the output source of the ACS calculator that are developed until the state number #256 are divided into four and assigned to the four ACS calculators 501 to 504.

Then, each ACS calculator 501 to 504 performs ACS calculations 64 times at a time-interval, thereby actualizing the ACS calculations of 256 states. The path metric memory 590 temporarily holds the path metric values (DT_ACS_PM0 to DT_ACS_PM256) of the 256 states output from each ACS calculator 501 to 504.

The ACS calculations of 256 states can be performed by four time-interval processes, using all 64 ACS calculators 501 to 505, and 564. In addition, through the provision of 256 ACS calculators in the ACS unit 50, the ACS calculations of 256 states can be performed by one process, using all 256 ACS calculators.

Figure 16:
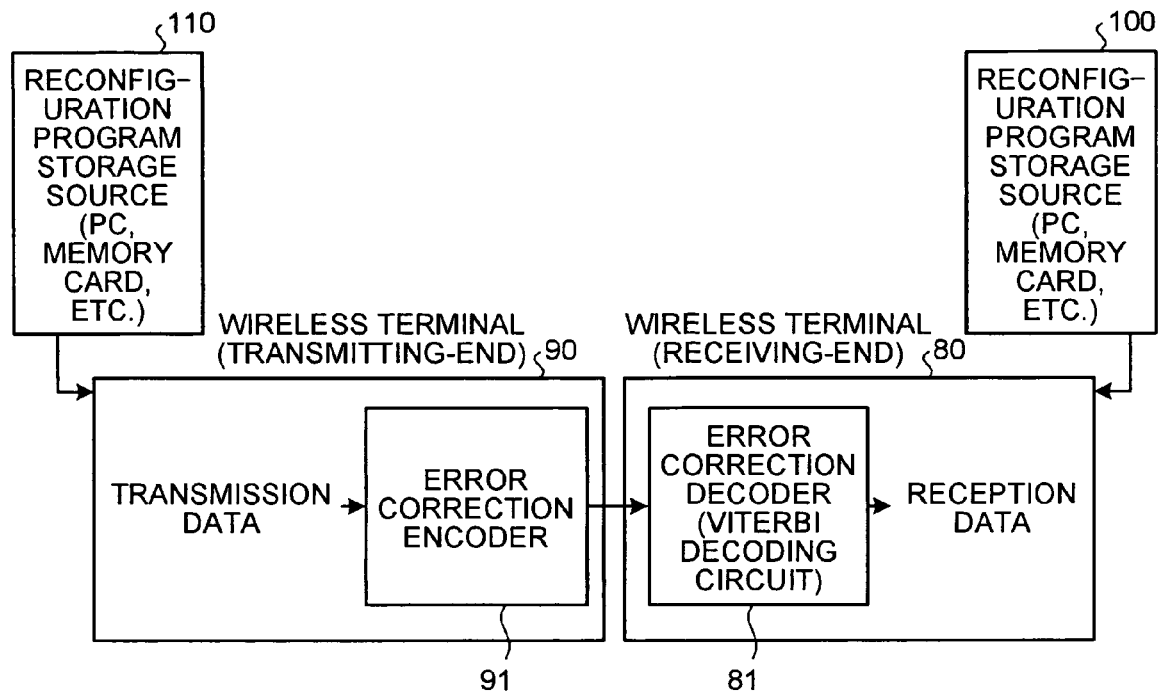
FIG. 16 is a block diagram of a wireless communication system including a wireless device having the Viterbi decoding circuit shown in FIG. 5.

Next, an application example of a wireless device having the Viterbi decoding circuit explained above is explained. FIG. 16 is a block diagram of a wireless communication system including this wireless device. As shown in FIG. 16, a wireless terminal (wireless device) 80 at a receiving-end includes an error correction decoder 81 that includes the Viterbi decoding circuit in FIG. 5. The Viterbi decoding circuit in the error correction decoder 81 is reconfigured by a reconfiguration program. A reconfiguration program storage source 100 is composed of, for example, a personal computer or a memory card and stores the reconfiguration program for reconfiguring the Viterbi decoding circuit.

A wireless terminal (wireless device) 90 at the transmitting-end includes a reconfigurable error correction encoder 91. The error correction encoder 91 is reconfigured by a reconfiguration program. A reconfiguration program storage source 110 is composed of, for example, a personal computer or a memory card and stores the reconfiguration program for reconfiguring the error correction encoder 91.

Figure 17:
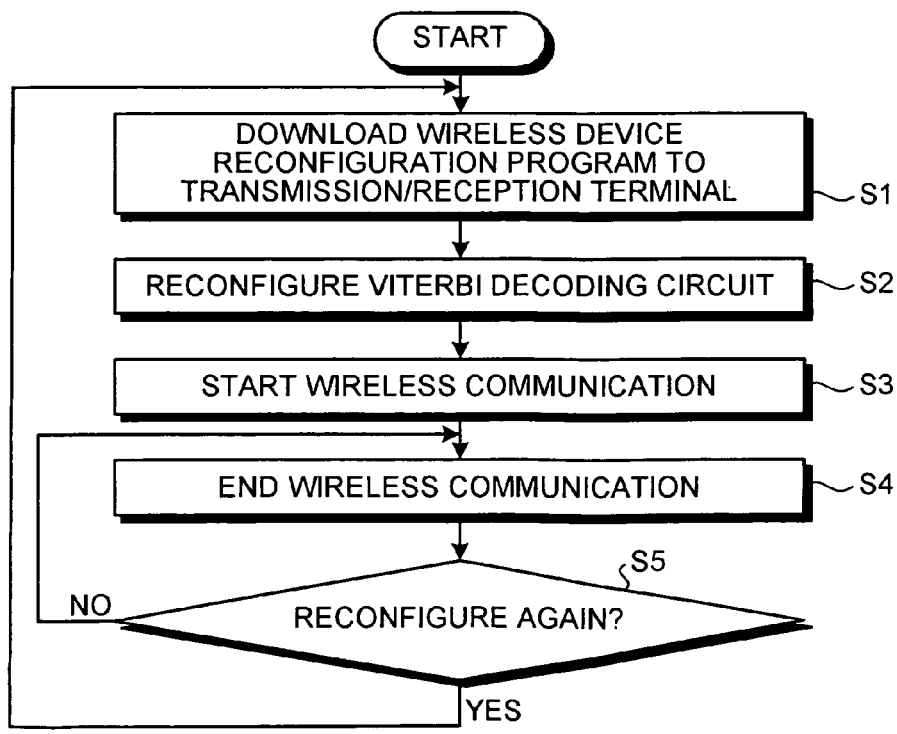
FIG. 17 is a flowchart of a process by the wireless communication system shown in FIG. 16.

FIG. 17 is a flowchart of a process by the wireless communication system shown in FIG. 16. As shown in FIG. 17, first, the reconfiguration program for reconfiguring the error correction encoder 91 is downloaded from the reconfiguration program storage source 110 by, for example, a wired connection. In addition, the reconfiguration program for reconfiguring the Viterbi decoding circuit is downloaded from the reconfiguration program storage source 100 by, for example, a wired connection (step S1). Next, in the wireless terminal 90 at the transmitting-end, the error correction encoder 91 is reconfigured using the reconfiguration program. In addition, in the wireless terminal 80 at the receiving-end, the Viterbi decoding circuit is reconfigured using the reconfiguration program (step S2).

After the reconfigurations of both wireless terminals 80 and 90 are completed, wireless communication between the terminals commences (step S3). Then, the wireless communication is completed (step S4) and whether to reconfigure the terminals again is judged (step S5). When judged that reconfiguration will be performed ("YES" at step S5), the process returns to step S1. When judged that reconfiguration will not be performed ("NO" at step S5), the wireless communication between the terminals is continued.

Figure 18:
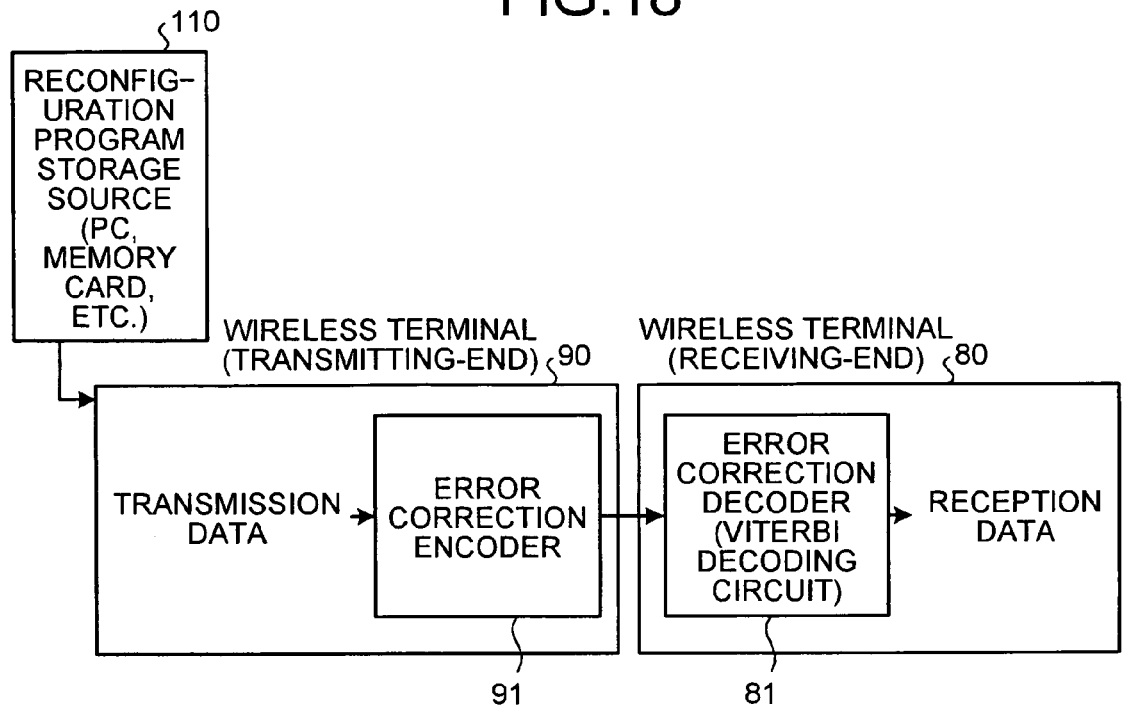
FIG. 18 is a block diagram of a wireless communication system including the wireless device having the Viterbi decoding circuit shown in FIG. 5.

FIG. 18 is a block diagram of another wireless communication system including the wireless device having the Viterbi decoding circuit explained above. In the wireless communication system shown in FIG. 18, the reconfiguration program storage source 110 stores the reconfiguration program for reconfiguring the Viterbi decoding circuit with the reconfiguration program for reconfiguring the error correction encoder 91. Therefore, in the system shown in FIG. 18, the reconfiguration program storage source 100 in FIG. 16 is not provided. Other configurations are the same as those shown in FIG. 16, and thus, the configurations are given the same reference numerals and the explanations thereof are omitted.

Figure 19:
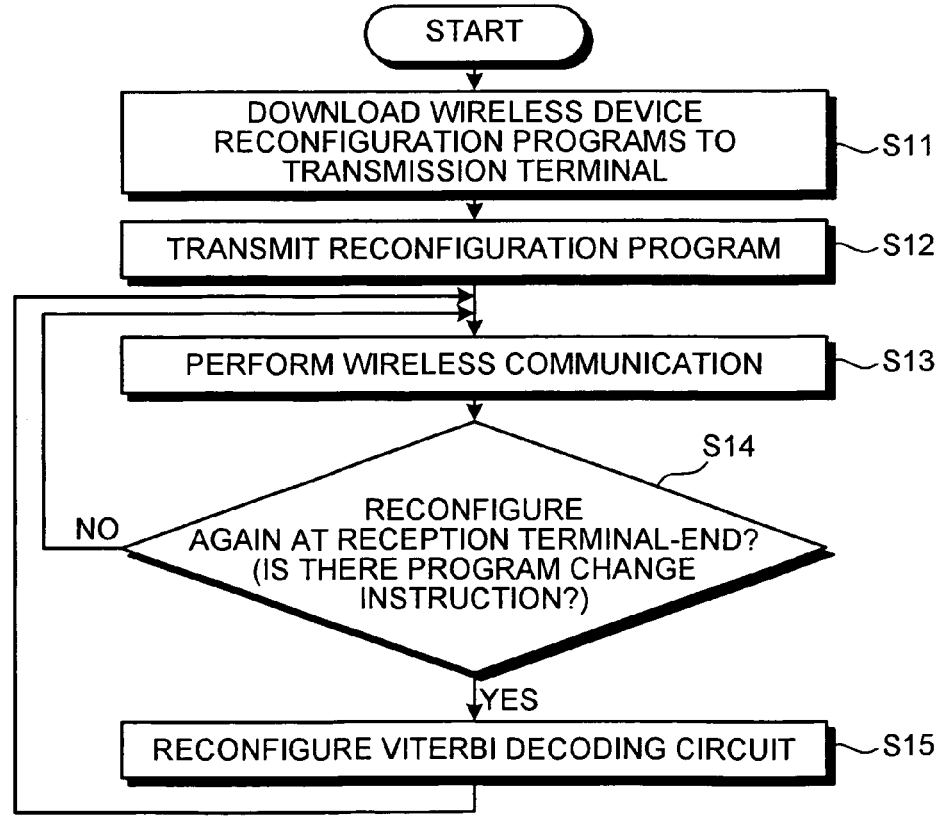
FIG. 19 is a flowchart of a process by the wireless communication system shown in FIG. 18.

FIG. 19 is a flowchart of a process by the wireless system in FIG. 18. As shown in FIG. 19, the wireless terminal 90 at the transmitting-end and the wireless terminal 80 at the receiving-end are both set to a default communication system. To start the wireless communication between the terminals in this state, first, the reconfiguration program for reconfiguring the error correction encoder 91 and the reconfiguration program for reconfiguring the Viterbi decoding circuit are downloaded from the reconfiguration program storage source 110 by, for example, a wired connection (step S11). Next, the wireless terminal at the transmitting-end transmits the reconfiguration program for reconfiguring the Viterbi decoding circuit to the wireless terminal at the receiving-end (step S12).

In the wireless terminal 90 at the transmitting-end, the error correction encoder 91 is reconfigured using the reconfiguration program. In the wireless terminal 80 at the receiving-end, the Viterbi decoding circuit is reconfigured using the reconfiguration program. After the reconfigurations of both wireless terminals 80 and 90 are completed, wireless communication is performed between the terminals (step S13). Then, whether the wireless terminal at the transmitting-end has sent an instruction to reconfigure the Viterbi decoding circuit to the wireless terminal at the receiving-end, namely, whether the Viterbi decoding circuit is reconfigured in the wireless terminal at the receiving-end is judged (step S14). If judged that the Viterbi decoding circuit is to be reconfigured ("YES" at step S14), the Viterbi decoding circuit is reconfigured (step S15) and the process returns to step S13. If judged that the reconfiguration is not performed ("NO" at step S15), the process returns to step 13 and the wireless communication between the terminals continues.

According to the embodiment above, the replica generating unit 30 replicates the specifications of the encoder at the transmitting-end based on the three types of parameters set in the setting register 10 and the topology between the calculators (interconnection information) is reconfigured based on the replicated specifications of the encoder. Thus, one Viterbi decoding circuit is compliant with a plurality of wireless communication technologies. In addition, capacity required to tabulate the interconnection information section that differs with each wireless technology can be reduced by the reconfiguration of only the interconnection information sections that differ with each wireless technology. Thus, a Viterbi decoding circuit that is compliant with wireless technologies and has a circuit size that is about 1.1 times the size of a conventional, single-wireless technology-compliant Viterbi decoding circuit can be actualized.

Furthermore, the interconnection information section that differs with each wireless technology is tabularized based on the three parameters set in the setting register 10. Thus, it is not necessary to provide a memory for each parameter combination and the circuit area can be reduced.

In addition, the tabularized information of the interconnection information section that differs with each wireless technology can be overwritten by merely changing the three parameters set in the setting register. Thus, the tabularized information of the interconnection information section that differs with each wireless technology can be overwritten in a short amount of time of a few milliseconds. Furthermore, because merely the three parameters are changed when the wireless technology is changed, the operation of the wireless device is simplified.

According to embodiments described above, it is possible to easily reconfigure a Viterbi decoding circuit according to a type of a wireless technology.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A Viterbi decoding circuit comprising:
    a setting register in which parameters are changeably set according to a type of wireless communication standard, the parameters including a code rate, a constraint length, and a generator polynomial;
    a branch metric calculating unit configured to calculate a branch metric of an input signal and to generate branch metric information in an amount according to the code rate;
    a replica generating unit configured to replicate, based on the generator polynomial, a specification of an encoder at a transmitting-end, and to generate setting information related to selection of the branch metric information;
    a branch metric selection unit configured to perform selection of an upper branch metric and a lower branch metric from among a plurality of pieces of the branch metric information, based on the setting information;
    an add-compare-select unit configured to determine a path metric for each step in a trellis diagram based on the upper branch metric and the lower branch metric, and to determine a surviving branch and a path metric value;
    a path memory unit configured to store the surviving branch and the path metric value; and
    a trace back unit configured to read out the surviving branch from the path memory unit, and to determine the shortest path metric by tracing back a trellis path in the trellis diagram;
    wherein the branch metric calculating unit is configured to generate eight pieces of branch metric information regarding an input signal A, an input signal B, and an input signal C, when the code rate is ⅓; and
    wherein the replica generating unit includes:
        a pseudo-data-sequence generating unit configured to sequentially generate pseudo data;
        a pseudo-data-sequence setting unit including a shift register composed of nine pieces of flip-flops to which the pseudo data are set, and configured to output a state number indicative of an internal state of the encoder and upper/lower branch metric information indicative of whether a branch metric is an upper branch metric or a lower branch metric as one of the setting information;
        a first AND gate group including nine units of AND gates of which one input is an input of the shift register and an output from each flip-flop in the shift register, respectively, and the other input is a value of each bit of a first generator polynomial provided by the replica generating unit;

a second AND gate group including nine units of AND gates of which one input is an input of the shift register and an output from each flip-flop in the shift register, respectively, and the other input is a value of each bit of a second generator polynomial provided by the replica generating unit;

a third AND gate group including nine units of AND gates of which one input is an input of the shift register and an output from each flip-flop in the shift register, respectively, and the other input is a value of each bit of a third generator polynomial provided by the replica generating unit;

a first exclusive OR calculator configured to perform exclusive OR operation on an output of each of the AND gates in the first AND gate group;

a second exclusive OR calculator configured to perform exclusive OR operation on an output of each of the AND gates in the second AND gate group; and a third exclusive OR calculator configured to perform exclusive OR operation on an output of each of the AND gates in the third AND gate group.

2. The Viterbi decoding circuit according to claim 1, further comprising a table in which the setting information is stored.

3. The Viterbi decoding circuit according to claim 1, wherein the branch metric selecting unit is configured to perform the selection according to a combination of an input signal A candidate, an input signal B candidate, and an input signal C candidate provided by the replica generating unit, for number of times corresponding to total number of states of the encoder.

4. The Viterbi decoding circuit according to claim 3, wherein the add-compare-select unit includes an add-compare-select calculator in at least number equal to the total number of states, and configured to perform add-compare-select calculation corresponding to the total number of states in one processing on upper branch metrics and lower branch metrics selected in the selection by the branch metric selecting unit, using same number of add-compare-select calculators as the total number of states.

5. The Viterbi decoding circuit according to claim 3, wherein the add-compare-select unit includes a plurality of add-compare-select calculators, and configured to perform add-compare-select calculation corresponding to the total number of states in a time-division processing, on upper branch metrics and lower branch metrics selected in the selection by the branch metric selecting unit, using less number of add-compare-select calculators than the total number of states.

6. A Viterbi decoding circuit comprising:

a setting register in which parameters are changeably set according to a type of wireless communication standard, the parameters including a code rate, a constraint length, and a generator polynomial;

a branch metric calculating unit configured to calculate a branch metric of an input signal and to generate branch metric information in an amount according to the code rate;

a replica generating unit configured to replicate, based on the generator polynomial, a specification of an encoder at a transmitting-end, and to generate setting information related to selection of the branch metric information;

a branch metric selection unit configured to perform selection of an upper branch metric and a lower branch metric from among a plurality of pieces of the branch metric information, based on the setting information;

an add-compare-select unit configured to determine a path metric for each step in a trellis diagram based on the upper branch metric and the lower branch metric, and to determine a surviving branch and a path metric value;

a path memory unit configured to store the surviving branch and the path metric value; and a trace back unit configured to read out the surviving branch from the path memory unit, and to determine the shortest path metric by tracing back a trellis path in the trellis diagram;

wherein the branch metric calculating unit is configured to fix an input signal C to a predetermined value and to generate four pieces of branch metric information regarding an input signal A and an input signal B, when the code rate is ½; and wherein the replica generating unit includes:

a pseudo-data-sequence generating unit configured to sequentially generate pseudo data;

a pseudo-data-sequence setting unit including a shift register composed of nine pieces of flip-flops to which the pseudo data are set, and configured to output a state number indicative of an internal state of the encoder and upper/lower branch metric information indicative of whether a branch metric is an upper branch metric or a lower branch metric as one of the setting information;

a first AND gate group including nine units of AND gates of which one input is an input of the shift register and an output from each flip-flop in the shift register, respectively, and the other input is a value of each bit of a first generator polynomial provided by the replica generating unit;

a second AND gate group including nine units of AND gates of which one input is an input of the shift register and an output from each flip-flop in the shift register, respectively, and the other input is a value of each bit of a second generator polynomial provided by the replica generating unit;

a third AND gate group including nine units of AND gates of which one input is an input of the shift register and an output from each flip-flop in the shift register, respectively, and the other input is a value of each bit of a third generator polynomial provided by the replica generating unit;

a first exclusive OR calculator configured to perform exclusive OR operation on an output of each of the AND gates in the first AND gate group;

a second exclusive OR calculator configured to perform exclusive OR operation on an output of each of the AND gates in the second AND gate group; and a third exclusive OR calculator configured to perform exclusive OR operation on an output of each of the AND gates in the third AND gate group.

7. The Viterbi decoding circuit according to claim 6, wherein the branch metric selecting unit is configured to perform the selection according to a combination of an input signal A candidate, an input signal B candidate, and an input signal C candidate provided by the replica generating unit, for number of times corresponding to total number of states of the encoder.

8. The Viterbi decoding circuit according to claim 7, wherein the add-compare-select unit includes an add-compare-select calculator in at least number equal to the total number of states, and configured to perform add-compare-select calculation corresponding to the total number of states in one processing on upper branch metrics and lower branch metrics selected in the selection by the branch metric selecting unit, using same number of add-compare-select calculators as the total number of states.

9. The Viterbi decoding circuit according to claim 7, wherein the add-compare-select unit includes a plurality of add-compare-select calculators, and configured to perform add-compare-select calculation corresponding to the total number of states in a time-division processing, on upper branch metrics and lower branch metrics selected in the selection by the branch metric selecting unit, using less number of add-compare-elect calculators than the total number of states.

10. A wireless device comprising the Viterbi decoding circuit according to claim 1.

* * * * *